United States Patent [19]

Miller et al.

[11] 4,375,036
[45] Feb. 22, 1983

[54] KEYBOARD STROBE GENERATION SYSTEM

[75] Inventors: Robert C. Miller, Braintree; David B. O'Keefe, Westford, both of Mass.

[73] Assignee: Honeywell Information Systems Inc., Waltham, Mass.

[21] Appl. No.: 157,748

[22] Filed: Jun. 9, 1980

[51] Int. Cl.³ .................. H03K 17/56; H03K 5/00
[52] U.S. Cl. ......................... 307/247 A; 307/520; 307/542; 340/365 E
[58] Field of Search ............ 307/247 R, 247 A, 520, 307/542; 340/365 R, 365 E; 365/193, 206

[56] References Cited

U.S. PATENT DOCUMENTS

| | | | |
|---|---|---|---|
| 3,668,432 | 3/1973 | Rhodes | 307/247 A |
| 3,749,940 | 7/1973 | Diepart et al. | 307/247 A |
| 3,753,007 | 8/1973 | Viswanathan | 307/247 A |
| 3,755,691 | 8/1973 | Cassarino | 307/247 A |
| 3,790,821 | 2/1974 | Adamson | 340/365 E |
| 3,962,699 | 6/1976 | Branson | 340/365 E |

Primary Examiner—Stanley D. Miller
Assistant Examiner—B. P. Davis
Attorney, Agent, or Firm—William A. Linnell; Nicholas Prasinos

[57] ABSTRACT

A strobe generator in a data entry input device is responsive to an input strobe signal from a keyboard system to generate a strobe signal which is not affected by electrical noise produced by electrostatically or electromagnetically induced signals in the signal lines running between the keyboard system and the data entry device input logic. An accurate output strobe signal is generated by utilizing a retriggerable logic circuit to filter out noise signals of a duration shorter than a predetermined period. The predetermined period is chosen to be less than the minimum duration of a valid input strobe signal and greater than the duration of active noise signals. The strobe generator retains the output strobe signal in the active state by use of a flip-flop until the strobe generator receives a reset signal acknowledging that the output strobe signal has been sampled by the data entry device input logic. Once set, the flip-flop will remain set and its corresponding output strobe signal remain active until reset, even if subsequent input strobe signals of less than or greater than the predetermined period are received.

6 Claims, 7 Drawing Figures

KEYBOARD STROBE GENERATION SYSTEM

BACKGROUND OF THE INVENTION

1. Field of the Invention

This invention relates to data entry systems and more particularly to strobe generators for use with electronic keyboard input systems.

2. Description of the Prior Art

In general, keyboard encoding systems in order to be reliable normally provide means for eliminating the adverse effects of switch contact bounce and the adverse effects of multiple key depressions. In order to eliminate contact bounce, a number of prior art systems have employed RC networks on switch contacts. Some other prior art systems use a strobe contact and intentially delay the output signal to eliminate any false signals because of contact bounce. For example one such system described in U.S. Pat. No. 3,668,432 to Russell R. Rhodes entitled "Logic Sensing Circuit Having Switch Contact Anti-Bounce Feature" uses capacitors connected to node inputs of gates in a bistable multivibrator to delay response of the multivibrator so that both outputs are simultaneously at the same signal level for enabling a gate to produce a strobe pulse. Other systems are designed to eliminate not only contact bounce but to detect multiple key depressions. One such system is described in U.S. Pat. No. 3,753,007 issued to G. R. Viswanathan entitled, "Strobe Generation System".

With the advent of solid-state keyboards employing Hall-effect technology and integrated circuits, keyboards are now available which eliminate problems of contact bounce and provide a relatively clean strobe signal as an output from the keyboard. However, these solid-state keyboards are often enclosed in a modular enclosure which is separate from the enclosure in which the data entry device input logic is housed. This results in the keyboard being connected to the data entry device input logic via a cable of approximately 3 feet in length. Experience has shown that this cable running between the keyboard enclosure and the enclosure housing the data entry device input logic is susceptible to the interjection of electrostatically or electromagnetically induced electrical noise which may cause the data entry input device to mistake a noise signal for a valid keyboard strobe signal thereby causing the data entry device input logic to input invalid data from the keyboard. These noise signals have rapidly and erratically changing characteristics such that the actual value or state of the signals is indeterminate. In particular, experience has shown that the movement of people on carpeting and other materials with poor anti-static properties in low humidity environments can result in electrostatic shocks being generated by contact with keyboard enclosure which can interfere with the proper operation of the keyboard by causing the data entry device input logic to mistakenly take a noise signal on the keyboard strobe line, created by the discharge of the static charge, as a keyboard strobe signal. One prior art method of preventing noise signals from being mistaken as a valid keyboard strobe signal is to filter out the noise signal by a series of flip-flops; the output of the first flip-flop connected as an input to the second, the output of the second flip-flop connected as an input to the third, and with the keyboard strobe signal connected as an input to the first flip-flop; with all flip-flops being clocked using a common clocking signal and with the output of each flip-flop being connected to a three-input AND gate and using the output of the AND gate as the validated keyboard strobe signal. Although this arrangement of serially connected flip-flops will in fact filter out noise which does not remain in an active state for longer than three clocking periods or does not have three pulses occuring at the same frequency as their clocking frequency, it has the disadvantage that multiple flip-flops are required and the adjustment of the filter's frequency requires a change in the flip-flop clocking frequency which will probably require a change in the layout of the wiring of the printed circuit board on which the filtering flip-flops are mounted.

OBJECTS OF THE INVENTION

Accordingly, it is a general object of this invention to provide an improved keyboard entry system which includes a strobe generator for enabling the device to sample keyboard generated information only when the information is valid.

It is a further object of this invention to provide strobe generator logic which maintains the keyboard strobe signal until such time as it is reset by logic indicating that the keyboard information has been sampled.

It is a specific object of this invention to provide a strobe generator circuit which generates a strobe signal which is not affected by noise induced into the cable connecting a keyboard with the data entry device input logic.

It is still a more specific object of this invention to provide a strobe generator which generates a strobe signal whose active state is maintained, even in the event of subsequent noise signals, until a reset signal is received indicating that the keyboard data has been sampled.

It is yet a still more specific object of this invention to provide a strobe generator whose noise filtering frequency may be changed by the substitution of components on a printed circuit board without the requirement for wiring changes between components.

SUMMARY OF THE INVENTION

The above and other objects are provided according to the basic concept of the invention through a strobe generator which in accordance with a key selection provides an output strobe designating a time period when valid information may be sampled. In the preferred embodiment, the strobe generator includes a circuit for filtering-out noise signals from valid input signals by filtering-out signals (noise) of a duration shorter than a predetermined period.

The circuit includes a retriggerable one-shot circuit adapted to receive an inverted input signal and whose output is used to clock a JK flip-flop. The J input of the JK flip-flop is adapted to receive a twice-inverted input signal such that if the input signal remains active for the predetermined period, the JK flip-flop will be set. The positive and negative outputs of the JK flip-flop can then be used to indicate the occurence of a valid input signal. By connecting the negative output of the JK flip-flop to the K input thereof, the occurence of a noise signal of less than or greater duration than the predetermined period will not reset the JK flip-flop whose active state is maintained until reset by a separate reset signal.

BRIEF DESCRIPTION OF THE DRAWINGS

The manner in which the apparatus of the present invention is constructed and its mode of operation can best be understood in light of the following detailed description taken together with the accompanying drawings in which like reference numerals identify like elements in the several figures and in which.

DETAILED DESCRIPTION OF THE PREFERRED EMBODIMENT

Figure 1:
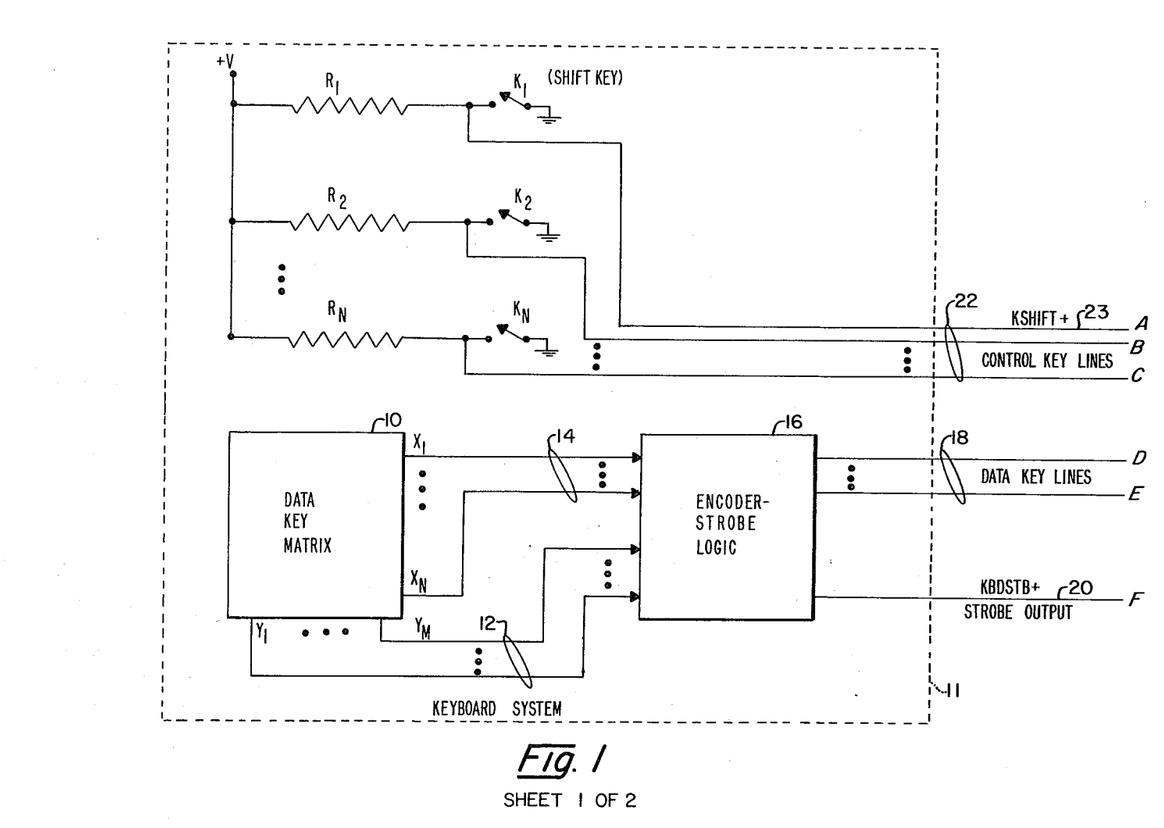
FIG. 1 is a block diagram of a keyboard system and data entry device input logic which incorporates the present invention.

FIG. 1 shows in block diagram form, a keyboard system 11 connected to data entry device input logic 21 by a series of signal lines 18, 20 and 22. In the preferred embodiment, data entry device input logic 21 is a CRT terminal controller connected to a computer comprised of a central processing unit (CPU), a main memory and other input/output devices (not shown). Data entered from the keyboard system 11 is displayed on a CRT monitor (not shown) attached to the data entry device input logic 21 and is also transferred, under the control of a program executed in the central processing unit, to the main memory. Although the terminal controller of the preferred embodiment contains other elements such as raster scan logic, refresh memory, and video generator, they are not illustrated in FIG. 1 because they do not directly interface with the keyboard system.

In the preferred embodiment, signal lines 18, 20 and 22 comprise a multi-conductor cable of approximately 3 feet in length which connects the keyboard system 11 to data entry device input logic 21. Keyboard system 11 includes two groups of keyboard switches (keys) the operation of which is used as input to data entry device input logic 21. The first set of keyboard keys illustrated as keys K1, K2 through KN are a set of control keys which provide the functions of: shift, break, uppercase lock, auto line feed, and remote in the preferred embodiment. Some of these control keys are detente keys which stay latched until they are depressed a second time. Control keys K1, K2 through KN are all illustrated in their unactivated state and are connected via pullup resistors R1, R2 through RN to positive DC voltage +V and to ground such that the signal on control key lines 22 will be a minimum of 2.4 volts DC when a key is activated (depressed) and a maximum of 0.4 volts DC when a key is unactivated. It being noted that key K1 is arbitrarily designated the shift key and the signal on its control key line 23 is designated as signal KSHIFT+.

The second set of keyboard keys is contained in data key matrix 10. In the preferred embodiment, data key matrix 10 is an 8 by 16 matrix of keys containing alphabetic, numeric, punctuation and other functions. The depression of any individual key within the matrix results in its X and Y coordinates being encoded on X lines 14 and Y lines 12. X coordinate lines 14, X1 through XN, and Y coordinate lines 12, Y1 through YN, are input to encoder-strobe logic 16 which binary encodes a number corresponding to the activated data key onto 7 data key lines 18 and also generates a strobe output on line 20. The number associated with the activated data key is encoded on data key lines 18 such that a binary ONE is represented by a signal of from a minimum of 2.4 volts DC to a maximum of 5.0 volts DC and a binary ZERO is represented by a signal of from a minimum of −0.5 volts DC to a maximum of 0.4 volts DC. Encoder-strobe logic 16 is such that it produces a strobe output on line 20 a minimum of 500 nanoseconds after the encoded data key signals on data key lines 18 are true. The duration of the strobe signal on line 20 (i.e., the time in which the strobe signal remains in the binary ONE state) is a minimum of 10 microseconds and a maximum of 100 microseconds. Further, encoder-strobe logic 16 is such that if two keys are activated (depressed) simultaneously the strobe signal goes to the binary ZERO state until one of the data keys in data key matrix 10 is released. Keyboard systems having the attributes described for those of the preferred embodiment are available from the Microswitch Division of Honeywell Inc., Freeport, Ill. 61032.

Continuing with the discussion of FIG. 1, data entry device input logic 21 takes the output of keyboard system 11 on lines 18, 20 and 22 and processes it as input. Basically, the data entry device input logic 21 illustrated in FIG. 1 functions as follows. The depression of one of the data keys of data key matrix 10 results in a strobe signal KBDSTB+ becoming a binary ONE on line 20 for a minimum of 10 microseconds. This keyboard strobe signal is received by keyboard strobe generator system circuit 25 and results in signal KINTRP+ on line 24 becoming a binary ONE and signal KINTRP− on line 26 becoming a binary ZERO which in turn results in signal LBIRQT− on line 42 becoming a binary ZERO which is interpreted as an interrupt request by microprocessor 46. The inversion function performed by keyboard strobe generator system circuit 25 and other elements described herein is indicated by a circle at the input or output of the elements. Microprocessor 46 processes the interrupt request under microprogram control by setting the data input multiplexer 44 select (SEL) signals on lines 60 which are connected to the two low order address bits of address bus 54 to the state such that the I4 inputs of data input multiplexer 44 will be multiplexed to the output thereof and by setting the high order address bits of address bus 54 to a state that will result in decoder 48 setting a binary ZERO on line 62 which is connected to the enable (EN) input of multiplexer 44 thereby enabling the output of data input multiplexer 44. With the I4 inputs of data input multiplexer 44 multiplexed onto the outputs (O) of multiplexer 44, lines 64 and data bus 58, microprocessor 46 can input the I4 input data at the microprocessor data (DATA) port via transceiver 50 and local data bus 56 under microprogram control and thereby determine which of three possible interrupt sources caused the interrupt. That is, microprocessor 46 can determine under microprogram control whether it was: a data key strobe appearing on line 24 by signal KINTRP+ being a binary ONE, a vertical retrace of the CRT raster scan which caused a signal KVERTR+ on line 28 to be a binary ONE, or a stop input/output from a program executing in the CPU which causes signal LSTPIO+ on line 30 to be a binary ONE. If any of these three interrupt sources was a binary ONE at the I4 inputs of data input multiplexer 44, its corresponding input to NOR gate 40 (signal LSTPIO− on line 36 as output by inverter 34, signal KVERTR− on line 38 as output by inverter 32, or signal KINTRP− on line 26 as output by keyboard strobe generator system circuit 25) will be a binary ZERO and cause an interrupt request to microprocessor 46.

In addition to multiplexing the three interrupt sources onto the output of data input multiplexer 44, the control key lines at the I4 input are also multiplexed onto the output of data input multiplexer 44 and can therefore be input the data inputs of microprocessor 46 under microprogram control. The control key lines 22, with the exception of the shift key signal KSHIFT+ on line 23, are grouped with the three interrupt source signals in the I4 inputs thereby allowing the microprogram to detect the activation of one or more of the control keys. This inputting of the control keys along with the interrupt source signals is particularly useful for those control keys which do not modify the meaning of the data keys. For example, the break control key operates independently of the data keys and must be periodically scanned to determine if the operator wants to break (interrupt) the operation of the terminal. Because the vertical retrace occurs 60 times per second to refresh the image on the CRT monitor, the KVERTR— signal can be used as a real time clock to periodically scan the control keys and allow the microprogram to detect the activation of the break control key. On the other hand, the shift control key signal on line 23 is grouped with the data key lines 18 into the I3 input of data input multiplexer 44 which allows it to easily modify the encoded value of the activated data key of data key matrix 10 which appears on data key lines 18.

If the microprogram executed by microprocessor 46 determines that the interrupt request was caused by signal KINTRP+ on line 24 becoming a binary ONE as the result of strobe output signal KBDSTB+ on line 20 becoming a binary ONE, the microprogram causes the microprocessor to set the select signals on line 60 for data input multiplexer 44 such that the I3 input data will be multiplexed onto the outputs and allow the data key lines 18 and the shift key signal on line 23 to be output by data input multiplexer 44 and input into microprocessor 46 via lines 64, data bus 58, transceiver 50 and local data bus 56. This allows the microprocessor to determine which of the data keys of data key matrix 10 has been activated by the operator.

The microprogram after inputting the encoded data key number stores it into scratch pad memory 66 for later processing during which the key number is translated into a character code such as ASCII or EBCDIC. After translation, the character code is stored in a buffer in scratch pad memory 66 which is later forwarded to the CPU when a software input command is executed in the CPU which may result in the character code being echoed to the terminal and stored it into the CRT refresh memory (not shown but controlled and connected in a manner similar to scratch pad memory 66). Data is stored into scratch pad memory 66 by the microprocessor 46, putting it on data bus 58 via local data bus 56 and transceiver 50 and by controlling address bus 54 such that it contains the address of the word is scratch pad memory 66 in the low order bits and the necessary control bits in the high order bits to have decoder 48 place a binary ZERO on line 68 to enable scratch pad memory 66.

After inputting the data key lines from input I3 of multiplexer 44, the microprogram resets the keyboard strobe generator system circuit 25 by setting the appropriate control signals on the high order address bits of address bus 54 via the microprocessor address (ADDR) port such that decoder 48 will set signal KINTRS— on line 72 to a binary ZERO. Signal KINTRS— becoming a binary ZERO will reset signal KINTRP+ to a binary ZERO and signal KINTRP— to a binary ONE thereby conditioning the data entry device input logic 21 for the next activation of a data key and its associated strobe signal.

In the summary, the keyboard system 11 and data entry device input logic 21 interface with keyboard strobe generator system circuit 25 as follows. The activation of a data key in data key matrix 10 results in encoder-strobe logic 16 placing a binary-encoded key number on data key lines 18 and the generation of a strobe pulse of a minimum of 10 microseconds on line 20. The strobe pulse on line 20 (signal KBDSTB+) becoming a binary ONE results in the keyboard strobe generator system circuit 25 placing a binary ONE on line 24 (signal KINTRP+) and a binary ZERO on line 26 (signal KINTRP—). Signal KINTRP— becoming a binary ONE at one input of NOR gate 42 results in the output thereof, signal LBIRQT— becoming a binary ZERO which causes an interrupt request to microprocessor 46. Under control of the microprogram stored in control memory 52 the output of which is enabled onto local data bus 56 by decoder 48 placing a binary ZERO on line 70, microprocessor 46 selects the I4 inputs of multiplexer 44 and determines the source of the interrupt requests. If the interrupt request was caused by the activation of a data key, the microprogram selects the I3 inputs of multiplexer 44 and inputs the binary-encoded value of the activated data key and also the status of the shift control key K1. After this data key K1 information is processed under microprogram control, the microprogram resets the keyboard strobe generator system circuit 25 by placing a binary ZERO on line 72 (signal KINTRS—) which in turn causes signal KINTRP+ to become a binary ZERO on line 24 and signal KINTRP— to become a binary ONE on line 26. After being reset, keyboard strobe generator system circuit 25 is in a condition to accept the next keyboard strobe pulse and hold it until the data key information is sampled.

Figure 2:
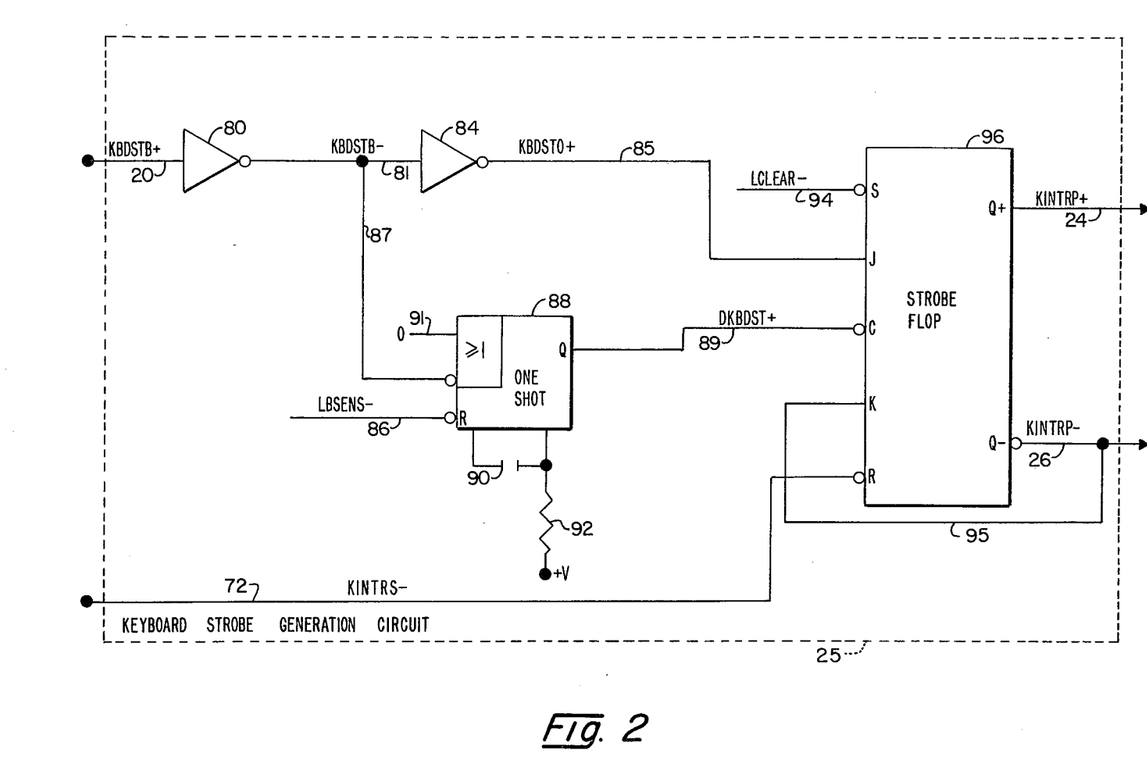
FIG. 2 shows in detail the keyboard strobe generation system circuit of the present invention; and, FIGS. 3A, 3B, 3C, 3D and 3E show five sets of wave forms used to illustrate the operation of the illustrative embodiment of the present invention.

FIG. 2 shows in detail the keyboard strobe generator system circuit 25 of the preferred embodiment. The purpose of keyboard strobe generator system circuit 25 is to distinguish between true keyboard strobes and noise, to hold a true keyboard strobe signal until other circuitry can respond to the keyboard strobe, and to retain a true keyboard strobe signal until it is acted upon by inhibiting the premature resetting of a true keyboard strobe by noise subsequent to the occurence of a true strobe. In the preferred embodiment, a true keyboard strobe is retained in a flip-flop the outputs of which as discussed hereinbefore are used as an interrupt request signal to the microprocessor 46 which samples the information on the data key lines 18 and then resets the strobe flip-flop.

The operation of the keyboard strobe generator system circuit 25 is for inverter 80 to see the positive-going edge of the keyboard strobe signal KBDSTB+ on line 20 as it changes from the binary ZERO to the binary ONE state and to invert the signal at its output such that signal KBDSTB— on lines 81 and 87 goes from the binary ONE to the binary ZERO state. This negative-going edge of the inverted keyboard strobe signal (KBDSTB—) on line 87 triggers one-shot 88 which acts as a time filter to insure that the keyboard strobe signal is still in the binary ONE state at the time the retriggerable one-shot 88 expires. One-shot 88 is a DC level sensitive retriggerable monostable multivibrator of the type that requires that the inverted keyboard strobe signal KBSTB— on line 87 be maintained in the binary ZERO state for the duration of the one-shot timeout period. If any negative-going transition occurs in the input on line 87, the one-shot 88 retriggers and delays anew the transition in its output signal DKBDST+ from the binary ONE to the binary ZERO state.

One-shot 88 provides an output pulse at the Q output whose duration is a function of external timing components capacitor 90 and resistor 92 which connect to positive DC supply voltage +V (nominal 5 volts). One-shot 88 has two triggering inputs, one input connected to line 91 which triggers when the input signal becomes a binary ONE and one connected to line 87 which triggers when the input signal becomes a binary ZERO. Line 91 is permanently connected to a binary ZERO such that one-shot 88 will be triggered only by the negative-going edge of signal KBDSTB— on line 87 as it transitions from the binary ONE to the binary ZERO state. Successive transitions of signal KBDSTB— on line 87 from the binary ONE to the binary ZERO state with a period shorter than the timeout period established by the external components will retrigger one-shot 88 and result in a continuous binary ONE output. If the retrigger pulse does not come within the predetermined timeout period after the initial trigger pulse, the Q outputs of one-shot 88 will switch from the binary ONE to the binary ZERO state at the end of the timeout period. A number of well-known components may be used to provide this mode of operation. In the preferred embodiment, one-shot 88 is a retriggerable monostable multivibrator of the type 9602 manufactured by Fairchild Semiconductor Corporation and described in their publication entitled *Fairchild Semiconductor TTL Data Book,* copyrighted 1973, which is incorporated herein by reference. In addition to having trigger inputs connected to lines 87 and 91, one-shot 88 has an overriding reset (R) input connected to line 86. When a binary ZERO signal is applied to the reset input, any timing cycle of one-shot 88 can be terminated or any new cycles inhibited until the binary ZERO signal is removed. In the preferred embodiment, signal LBSENS— is normally a binary ONE and is set to a binary ZERO only for test purposes during the manufacturing process. The timeout period for one-shot 88 is defined in accordance with the following equation: $T = 0.31RC(1 + 1/R)$ where R is the value of resistor 92 in kilohms, C is the value of capacitor 90 in picofarads and T is in nanoseconds. In the preferred embodiment, R is 10 kilohms and C is 910 picofarads which yields a T of 3103.1 nanoseconds and referred hereinbefore and hereinafter as a value of 3 microseconds.

In the normal case in which the strobe signal KBDSTB+ goes to the binary ONE state and remains in the binary ONE state for the duration of the one-shot timeout period, which in the preferred embodiment is approximately 3 microseconds, the delayed keyboard strobe signal at the output of one-shot 88, signal DKBDST+ on line 89, will transition from the binary ONE to the binary ZERO state and clock JK flip-flop 96. In the preferred embodiment, strobe flop 96 is a JK negative-edge triggered flip-flop of the type SN74LS112 manufactured by Texas Instruments Incorporated of Dallas, Tex. 75222 and described in their publication entitled, *The TTL Data Book for Design Engineers,* Second Edition, copyrighted 1976, which is incorporated herein by reference. In this normal case, twice-inverted keyboard strobe signal KBDSTO+ output by inverter 84 on line 85 will be in the binary ONE state at the J data input of strobe flop 96 and results in the toggling of flop 96 from the reset to the set state making the Q+ output signal KINTRP+ a binary ONE on line 24 and the Q— inverted signal KINTRP— on lines 26 and 95 a binary ZERO. In this normal case, before the occurence of a true keyboard strobe signal, strobe flop 96 is in the reset state making the Q+ output signal KINTRP+ on line 24 a binary ZERO and the Q— output signal KINTRP— on lines 26 and 95 a binary ONE and with signal LCLEAR— on line 94 at the set (S) input a binary ONE and signal KINTRS— at the reset (R) input a binary ONE. Thus, when a true keyboard strobe signal occurs, the twice-inverted keyboard strobe signal KBDSTO+ on line 85 at the J input of strobe flop 96 will still be a binary ONE at the J input 3 microseconds later when the clocking signal DKDBST+ transitions from the binary ONE to the binary ZERO state thereby clocking strobe flop 96 with a binary ONE at its J input and a binary ZERO at its K input. This input combination causes a JK flip-flop to toggle which in the instant case means going from the reset to set state. It being noted that as mentioned hereinbefore that a true keyboard strobe signal remains in the binary ONE state for a minimum of 10 microseconds and a maximum of 100 microseconds.

Because one-shot 88 is a retriggerable one-shot it can be appreciated that the keyboard strobe signal at the J input of strobe flop 96 must remain in the binary ONE state for the timeout period of the one-shot without transitioning to the binary ZERO state. This requirement that the strobe signal on line 20 remain in the binary ONE state for a period equal to the one-shot timeout period assures that the strobe flop 96 will not be set by any noise signal on line 20 which remains in the binary ONE state for a period less than the one-shot timeout period of 3 microseconds.

In addition to insuring that noise on the keyboard strobe line 20 will not cause the setting of strobe flop 96 and thereby cause the microprocessor to input invalid data key information, keyboard strobe generator system circuit 25 insures that noise on the keyboard strobe line 20 after the setting of strobe flop 96 but before the keyboard data has been sampled by the microprocessor 46 (see FIG. 1) will not result in the premature resetting of strobe flop 96 and thereby result in the missing of valid keyboard data. This inhibiting of the premature resetting of the strobe flop 96 by noise on the keyboard strobe line is accomplished by inputting the Q— output of strobe flop 96 at the K data input of strobe flop 96. Thus after being set by a true keyboard strobe signal, signal KINTRP— on line 95 will be in the binary ZERO state at the K input of strobe flop 96. This binary ZERO signal at the K input of strobe flop 96 inhibits a noise signal on line 20 from changing the state of strobe flop 96 by inhibiting the clocking of the data at the J input of strobe flop 96 by the negative-going edge of clocking signal DKBDST+ which will occur 3 microseconds after the last positive-going edge of a noise signal on line 20. This inhibiting by the binary ZERO at the K input of strobe flop 96 thus maintains strobe flop 96 in its current state which when set will retain the Q+ output signal KINTRP+ on line 24 in the binary ONE state until the microprocessor 46 can respond to the interrupt request and sample the information on key data lines 18 (see FIG. 1).

It should be noted that, if for some reason the first keyboard strobe was not responded to before the occurence of a second keyboard strobe, the clocking of the strobe flop 96 by the negative-going edge of signal DKBDST+ at the clock (C) input on line 89 will result in the clocking of the binary ONE at the J input onto the Q+ output and thus result in no change in the status of the outputs of strobe flop 96 from the state in which they were before the occurence of the second clocking signal. That is, once strobe flop 96 is set by a valid strobe signal, subsequent noise which will cause a clocking signal on line 89 will not result in the change of state of strobe flop 96 because a binary ZERO will be present at both the J and K inputs when the strobe flip-flop is clocked thus allowing strobe flop 96 to remain in its initial state. Alternately, if strobe flop 96 is set by a valid strobe signal and is not reset prior to the occurence of a second valid strobe signal, the clocking of the strobe flop 96 by the second clocking signal on line 89 will result in the binary ONE at the J input being clocked onto the Q+ outputs setting the JK flip-flop 96. This setting of strobe flop 96 results in no state change of the flip-flop which was already in the set state prior to the occurrence of the second keyboard strobe signal. This occurrence of a second valid keyboard strobe signal before the first keyboard strobe signal has been processed results in the loss of the first keyboard strobe signal and its corresponding data key information but still allows the circuit 25 to be in a state such that, after the second keyboard strobe signal is processed, the circuit will be reinitialized to the proper state by the KINTRS— signal on line 72 to receive a third keyboard strobe signal. Further, circuit 25 remains in a state to reject any false strobe signals occuring between the second and third true strobe signals.

As discussed hereinbefore, following the setting of strobe flop 96, signal KINTRP+ on line 24 along with signal KINTRP— on line 26 are used by the other data entry device input logic to initiate the processing of the keyboard strobe signal. In the preferred embodiment this results in an interrupt to microprocessor 46 (see FIG. 1) which after the inputting of the data key information from lines 18 results in the microprocessor setting signal KINTRS— on line 72 to a binary ZERO state to reset strobe flop 96 and make signal KINTRP+ a binary ZERO and signal KINTRP— a binary ONE. After resetting strobe flop 96, signal KINTRS— is returned to the binary ONE state.

Before discussing the noise rejection capabilities of keyboard strobe generator circuit 25, it should be noted that circuit 25 is initialized when power is applied to the data entry device input logic 21 by logic not shown setting signal LCLEAR— on line 94 to a binary ZERO and then returning it to a binary ONE while maintaining signal KINTRS— on line 72 as a binary ONE. This results in the setting of strobe flop 96 which will cause microprocessor 46 (see FIG. 1) to process the strobe interrupt under microprogram control and eventually reset strobe flop 96 by setting signal KINTRS— on line 72 to a binary ZERO and then returning it to a binary ONE thus resetting strobe flop 96. This setting and resetting of strobe flop 96 is used to check the operation of the data entry device input logic 21 during the power up sequence and to establish strobe flop 96 in the reset state prior to the occurence of the first keyboard strobe signal on line 20.

Figure 3A:
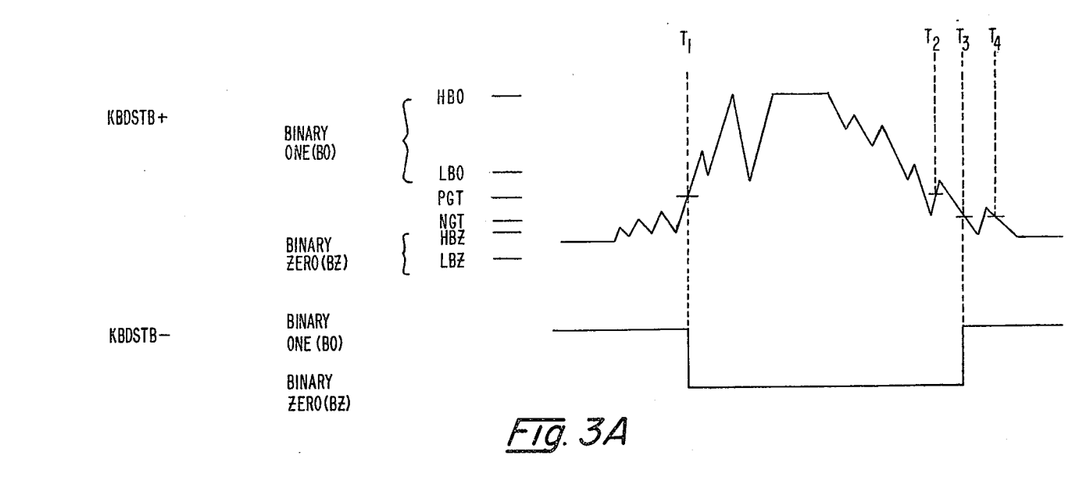

Referring now to FIGS. 2, 3A, 3B, 3C, 3D, and 3E, the signal noise rejection capabilities of the keyboard strobe generator circuit 25 will now be described. FIG. 3A shows a representative noisy keyboard strobe input signal KBDSTB+ on line 20 as input to inverter 80 and the corresponding output signal KBDSTB— on lines 81 and 87 as output by inverter 80. In the preferred embodiment, inverter 80 is a Schmitt-triggered inverter with the hysteresis between the positive-going threshold voltage and the negative-going threshold voltage being used to filter noise on the keyboard strobe line 20. Referring now to the voltage wave form of FIG. 3A it can be seen that the voltage of a signal between LBZ (low binary zero) and HBZ (high binary zero) is considered to be a binary ZERO. A signal voltage between LBO (low binary one) and HBO (high binary one) is considered to be a binary ONE. As mentioned hereinbefore, in the preferred embodiment, for the TTL level signals used in the preferred embodiment, voltage LBZ is —0.5 volts and voltage HBZ is 0.4 volts DC, voltage LBO is 2.4 volts DC and voltage HBO is 5.0 volts DC. Voltage PGT is the positive-going threshold voltage for inverter 80 and voltage NGT is the negative-going threshold voltage for inverter 80. In the preferred embodiment, inverter 80 is a Schmitt-triggered inverter of the type SN74LS14 manufactured by Texas Instruments Incorporated of Dallas, Tex. 75222 and described in their publication *The TTL Data Book for Design Engineers*, Second Edition.

As illustrated in FIG. 3A, output signal KBDSTB— of inverter 80 will switch from the binary ONE state to the binary ZERO state only if a positive-going voltage exceeds the positive-going threshold PGT as it does in FIG. 3A at time T1. Once the output signal KBDSTB— switches to the binary ZERO state as is illustrated at time T1 the output signal will remain in the binary ZERO state until the input signal KBDSTB+ is less than the negative-going threshold NGT voltage as is illustrated at time T3 in FIG. 3A. Having exceeded the positive-going threshold PGT at time T1 in FIG. 3A, the output signal will remain in the binary ZERO state until the input voltage is less than the negative-going threshold as is illustrated at time T3 and is not affected by any positive-going voltages which cross the positive-going threshold as is illustrated at time T2. Similarly, once the input voltage of signal KBDSTB+ is less than the negative-going threshold NGT a subsequent rise and fall of the input signal voltage through the negative-going threshold NGT, such as occurs at time T4, will not affect the output signal KBDSTB— unless the positive-going threshold is exceeded.

FIGS. 3B, 3C, 3D, and 3E illustrate the noise filtering capabilities of one-shot 88 and JK flip-flop 96. FIGS. 3B, 3C, 3D, and 3E each illustrate the voltage wave form of keyboard strobe signal KBDSTB+ on line 20, the delayed keyboard strobe signal DKBDST+ on line 89 as output by one-shot 88 and the keyboard interrupt signal KINTRP+ on line 24 as output at the Q+ output of strobe flop 96. The wave form of the keyboard strobe signal at the output of inverter 84, signal KBDSTO+ on line 85 is substantially the same as the wave form of the keyboard strobe signal KBDSTB+ on line 20 at the input of inverter 80 if the hysteresis effect of inverter 80 is ignored and the propagation delay of inverters 80 and 84 are also ignored. The state of the keyboard strobe signal KBDSTO+ on line 85 at the J input of strobe flop 96 is important in determining whether the strobe flop 96 will be set when clocked by the delayed strobe signal DKBDST+ on line 89 at the clock input. In FIGS. 3B, 3C, 3D, and 3E the initial conditions are such that strobe flop 96 is in the reset condition such that the signal at its Q+ output on line 24 signal KINTRP+ is in the binary ZERO (BZ) state and that the keyboard strobe signal KBDSTB+ on line 20 is in the binary ZERO state and has been in the binary ZERO state for a period of time exceeding that of the delay period of one-shot 88 such that the output of one-shot 88 (signal DKBDST+ on line 89) is also in the binary ZERO state.

Figure 3B:
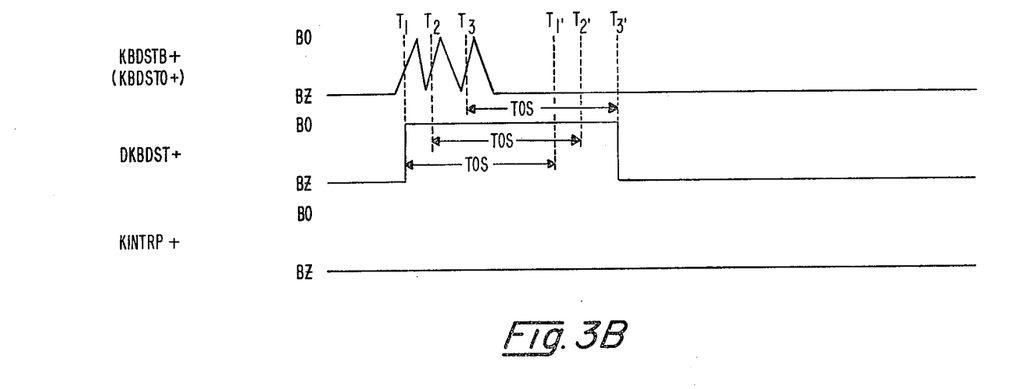

FIG. 3B illustrates the case in which the keyboard strobe signal KBDSTB+ at the input of inverter 80 goes from the binary ZERO to the binary ONE (BO) state in a succession of three noise spikes. At time T1, T2 and T3 the voltage of the keyboard strobe signal KBDSTB+ exceeds the positive-going threshold voltage of inverter 80 and the output thereof (signal KBDSTB−) becomes a binary ZERO and triggers one-shot 88 causing the output thereof (signal DKBDST+) to go from the binary ZERO to the binary ONE state as at time T1 or to remain in the binary ONE state as at retrigger times T2 and T3. As discussed hereinbefore, the output of one-shot 88 will remain in the binary ONE state for a period of time of the one-shot 88 which in the preferred embodiment is 3 microseconds. This one-shot time (delay) period is illustrated in FIGS. 3B, 3C, 3D and 3E as time TOS such that after being triggered at time T1, if one-shot 88 is not retriggered, the output signal DKBDST+ will go from the binary ONE to the binary ZERO state at time T1'. Because the negative-going voltage of signal KBDSTB+ passes through the negative-going threshold of inverter 80 as the signal returns from the binary ONE to the binary ZERO state between times T1 and T2, the output of inverter 80 signal KBDSTB− at the input of one-shot 88 will change from the binary ZERO to the binary ONE state followed by a change from the binary ONE state to the binary ZERO state at time T2 as the positive-going voltage of signal KBDSTB+ goes through the positive-going threshold of inverter 80 at time T2. This second occurence of the negative-going edge of signal KBDSTB− at the trigger input of one-shot 88 will retrigger one-shot 88 resetting the clock to zero and starting the timeout period of TOS all over again at time T2 such that that time period TOS will expire at time T2'. This resetting of one-shot 88 at time T2 inhibits the negative-going edge of signal DKBDST+ at its output from occuring at time T1' and conditions the one-shot 88 such that it will occur at time T2'. However, at time T3 one-shot 88 is again retriggered by negative-going edge of signal KBDSTB− at the input of one-shot 88 such that one-shot 88 is conditioned to have the negative-going edge of signal DKBDST+ occur at time T3'. After time T3 the voltage of the keyboard strobe signal KBDSTB+ goes to the binary ONE state and returns to the binary ZERO state where it remains until time T3' without again crossing through the positive-going threshold of inverter 80 thereby allowing one-shot 88 to time out at time T3' and have its output signal, keyboard delayed signal DKBDST+ go from the binary ONE to the binary ZERO state at time T3'. The occurence of this negative-going pulse at the clock input of strobe flop 96 causes the JK flip-flop to clock the J and K inputs onto its outputs. At time T3' the signal KBDSTO+ at the J input is a binary ZERO and signal KINTRP− on line 95 at the K input is a binary ONE such that the J input is clocked into strobe flop 96 and the Q+ output signal KINTRP+ remains in the binary ZERO state and signal KINTRP− on lines 26 and 95 at the Q− output remains in the binary ONE state. FIG. 3B shows that the positive-going edge of signal KBDSTB+ is delayed by the period of one-shot 88 for time TOS such that the output of one-shot 88, delayed keyboard strobe signal DKBSTB+, will have a negative-going edge which transitions from the binary ONE to the binary ZERO state after the delay period time TOS expires after the last transition of the keyboard strobe signal KBDSTB+ from the binary ZERO to the binary ONE state.

Figure 3C:
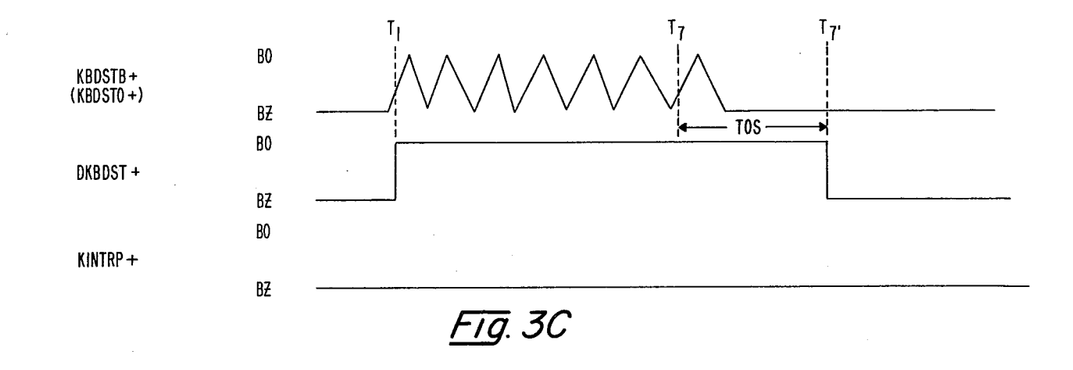

FIG. 3C, a further illustration of the case illustrated in FIG. 3B, shows clearly that the noise filtering capability of one-shot 88 is not limited to filtering out bursts of noise less than time period TOS but will also filter out a burst of noise which exceeds time period TOS. In FIG. 3B the burst of noise on keyboard strobe line 20 lasted for less than the one-shot timeout period of TOS and did not result in the setting of strobe flop 96 as discussed above. In FIG. 3C the burst of noise exceeds one-shot timeout period TOS but it also does not result in the setting of strobe flop 96. As can be appreciated in the discussion of FIG. 3B, as long as the keyboard strobe signal KBDSTB+ has a wave form such that the positive-going voltage will pass through the positive-going threshold of inverter 80 for a second time within the one-shot timeout period of TOS, one-shot 88 will be retriggered and inhibited from timing out. This retriggering delays the negative-going edge of one-shot 88 output signal DKBDST+ on line 89 until the one-shot timeout period of TOS has expired after the last occurence of the last retriggering of the one-shot 88 by signal KBDSTB+ going through the positive-going threshold. FIG. 3C illustrates that one-shot 88 will be retriggered at time T7 and the one-shot period time out at time T7' producing the negative-going edge of delayed keyboard strobe signal DKBDST+. Again, as in the case illustrated in FIG. 3B the negative-going edge of signal DKBDST+ at time T7' will clock strobe flop 96 and because the J input is a binary ZERO and the K input is a binary ONE strobe flop 96 will not be set and signal KINTRP+ at the output thereof will remain in the binary ZERO state.

Figure 3D:
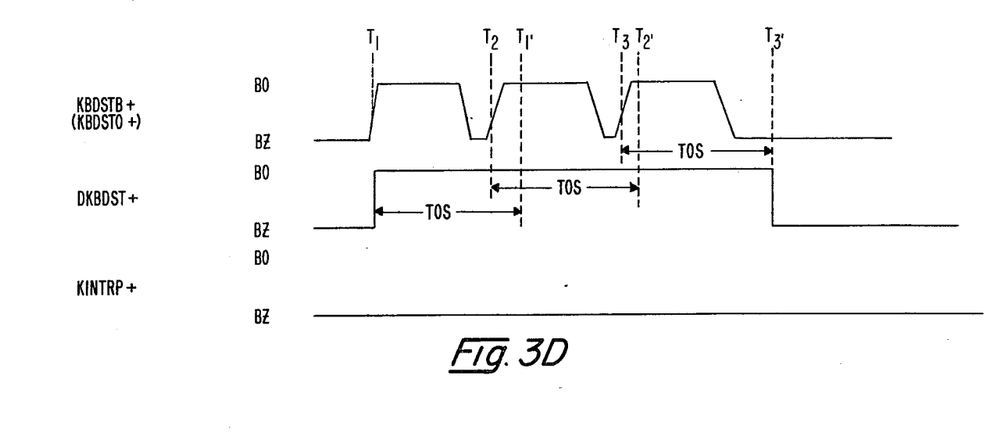

FIG. 3D is a combination of the cases illustrated in FIGS. 3B and 3C. FIG. 3B illustrates the case in which the burst of noise on the keyboard strobe line 20 was less than the timeout period of one-shot 88 such that no strobe pulse within the burst of noise was sufficiently along to allow one-shot 88 to time out and cause the output to clock strobe flop 96 and sample the input signals at the J and K inputs. FIG. 3C illustrates the case in which the burst of noise on the keyboard strobe line 20 is longer than the one-shot timeout period TOS but the retriggering properties of one-shot 88 prevent the burst of noise as being interpreted as a valid keyboard strobe even though its duration is longer than the nominal value of a valid keyboard strobe of 10 microseconds of the preferred embodiment. In FIG. 3C the noise signal is not taken as a valid keyboard strobe because the keyboard strobe signal KBDSTB+ does not remain in the binary ONE state for 3 microseconds after the last positive-going edge of signal KBDSTB+ retriggers one-shot 88. Although the wave forms illustrated in FIGS. 3B and 3C for noise on keyboard strobe line 20 are probably closer to wave forms of a noise-induced signal, for example that introduced by the discharge of a static electric charge, FIG. 3D illustrates the extreme noise rejection capabilities of the present invention.

FIG. 3D illustrates again the case in which the keyboard strobe signal is not in a binary ONE state for long enough at any one time to be interpreted as a true keyboard strobe signal and therefore the strobe flop 96 is not set when it is clocked at time T3'. FIG. 3D illustrates that the one-shot 88 is retriggered at times T2 and T3 prior to the expiration of the previous timeout periods TOS such that when the one-shot does time out at time T3' the value of the input signal at the J input of strobe flop 96 is a binary ZERO when the strobe flop 96 is clocked.

By examining FIG. 3D it can be appreciated that the timeout period of the one-shot 88 must be chosen such that it is less than the length of time that a valid keyboard strobe signal will remain in the binary ONE state. In the case of the preferred embodiment, this is for a minimum of 10 microseconds for a valid keyboard strobe. In the preferred embodiment, appropriate values for capacitor 90 and resistor 92 were chosen to provide for this nominal 3 microsecond timeout period for one-shot 88. A 3 microsecond timeout period is well within the 10 microsecond minimum valid keyboard strobe pulse duration and is sufficient such that any deviation from the 3 microseconds value caused by tolerances in values of capacitor 90, resistor 92 and voltage level +V will still result in the timeout period being well within the 10 microsecond minimum duration of a valid keyboard strobe.

It can be appreciated that the closer the one-shot 88 timeout period is to the minimum duration of a valid keyboard strobe that the circuit 25 will have a greater capacity to reject possible noise-induced signals when the keyboard strobe is in the binary ZERO state. However, this rejection of positive noise signals must be balanced against the desire not to have valid keyboard strobes rejected by negative noise signals during the time that a true keyboard strobe signal is in the binary ONE state. Therefore, choosing a value for the delay period of one-shot 88 that is too close to the minimum duration of a true keyboard strobe signal may result in keyboard strobe generator circuit 25 rejecting a valid keyboard strobe signal if noise occurs during the time that the keyboard strobe signal is in the binary ONE state. The possibility of the rejection of a valid keyboard strobe signal by choosing a one-shot delay period too close to that of the minimum strobe pulse length can be appreciated by examining FIG. 3E.

Figure 3E:
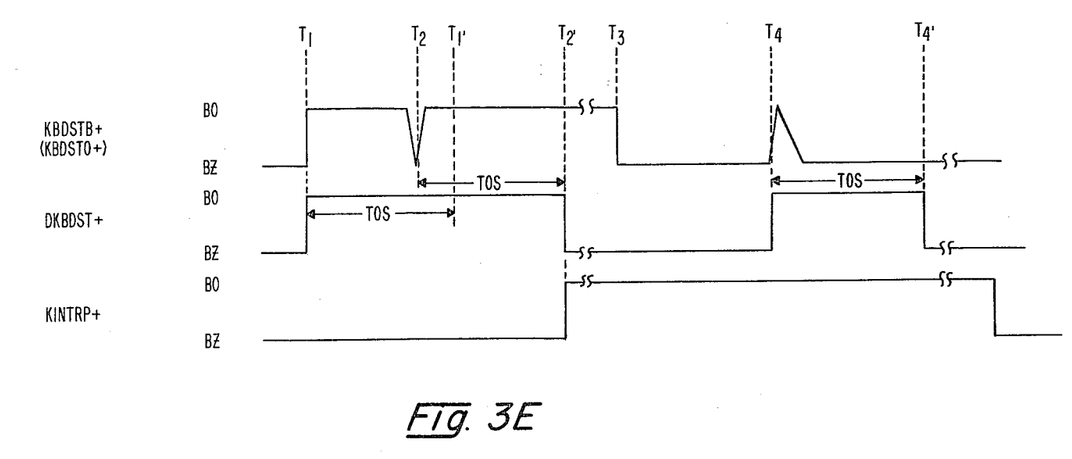

FIG. 3E illustrates the case in which a valid keyboard strobe signal occurs at time T1 and lasts to time T3 which in the preferred embodiment is a minimum of 10 microseconds. In FIG. 3E, the valid keyboard strobe signal goes from the binary ZERO to the binary ONE state at time T1 and initiates the timeout period of one-shot 88. At a time just prior to time T2, noise on line 20 causes the valid keyboard strobe signal to become a binary ZERO passing through the negative-going threshold of inverter 80 with a subsequent return to the valid binary ONE state passing through the positive-going threshold at time T2 which causes one-shot 88 to be retriggered. This retriggering at time T2 reinitializes the timeout period of one-shot 88. If no further noise is introduced into the keyboard strobe signal KBDSTB+ after time T2, one-shot 88 will time out at time T2' and cause delayed keyboard strobe signal DKBDST+ to go from the binary ONE to the binary ZERO state and clock strobe flop 96 which will result in strobe flop 96 being toggled from the reset to the set state because signal KBDSTO+ at the J input is in the binary ONE state and signal KINTRP— at the K input is also in the binary ONE state. The negative-going edge of the clocking signal at time T2' causes the strobe flop 96 to toggle from the reset to the set state and makes the Q+ output (signal KINTRP+ on line 24) a binary ONE and the signal at the Q— output (signal KINTRP— on lines 26 and 95) a binary ZERO. At time T3 the keyboard strobe signal KBDSTB+ changes from the binary ONE to the binary ZERO state at the end of the valid keyboard strobe pulse.

Thus it can be appreciated that if a timeout period of one-shot 88 is chosen to be too near the minimum duration of the binary ONE state of a valid keyboard strobe signal, any noise which causes a valid keyboard strobe signal to go from the binary ONE to the binary ZERO state may inhibit keyboard strobe generator circuit 25 from seeing the valid keyboard strobe signal on line 20 and inhibit the the setting of strobe flop 96. In the preferred embodiment where the valid keyboard strobe signal is in the binary ONE state for a minimum of 10 microseconds, the timeout period for one-shot 88 is a nominal 3 microseconds. Any noise occurring that results in one or two relatively short bursts of noise or one relatively long burst of noise will not interfere with the keyboard strobe generation circuit 25 from seeing a valid keyboard strobe signal and thus not interfere with the setting of strobe flop 96.

The ability of keyboard strobe generation circuit 25 to withstand noise occurring subsequent to a valid keyboard strobe signal can be appreciated by examining the right portion of FIG. 3E. If, after the strobe flop 96 has been set at time T2' by one-shot 88 timing out and clocking the J and K inputs of strobe flop 96 followed by the subsequent return to a binary ZERO state of the keyboard strobe signal KBDSTB+ at time T3, a subsequent spike of noise occurs on keyboard strobe line 20 at time T4, it will trigger one-shot 88 cause signal DKBST+ to become a binary ONE at time T4 and return to the binary ZERO state with its negative-going edge at time T4'. This negative-going edge of delayed keyboard strobe signal DKBDST+ at time T4' will again clock strobe flop 96 with its J input signal KBDSTO+ in the binary ZERO state and its K input signal KINTRP— in the binary ZERO state (the opposite of signal KINTRP+). With the J and K inputs of strobe flop 96 both being in the binary ZERO state, the clocking of the strobe flop 96 will result in strobe flop 96 retaining its initial state prior to the clocking. That is, strobe flop 96 remains set which results in the Q+ output signal KINTRP+ remaining in the binary ONE state and its Q— output signal KINTRP— remaining in the binary ZERO state. Thus it can be seen that the second strobing of strobe flop 96 at time T4' by the noise-induced signal on line 20 does not result in the resetting of strobe flop 96 and the subsequent loss of a valid keyboard strobe signal. Therefore, once strobe flop 96 is set it will remain set until reset by the reset signal KINTRS— becoming a binary ZERO in response to a reset command from microprocessor 46.

The ability of strobe flop 96 to retain a valid keyboard strobe signal pending its processing by a microprocessor 46 is one of the unique properties of JK flip-flop 96. If a D-type flip-flop was used in place of the JK flip-flop for strobe flop 96, with the data input coming from keyboard strobe signal KBDSTO+ on line 85 and the delayed keyboard strobe signal DKBDST+ on line 89 being used as the clocking signal, the occurrence of subsequent noise signal on keyboard strobe line 20 would result in the resetting of the strobe flop 96. The feeding back of the Q— output of strobe flop 96 on line 95 to the K input inhibits this erroneous resetting of the strobe flop 96 by noise occurring subsequent to the valid keyboard strobe signal but prior to the processing of the keyboard strobe signal.

Although the present invention has been described in terms of a keyboard system interfacing with a data entry device input logic, it is envisioned that many of the principles of the present invention can be employed with respect to different types of signals being transmitted between different types of devices. Further it will be appreciated by those skilled in the art that many changes may be made in the illustrative embodiment without departing from the spirit and scope of the invention. For example, although certain circuits have been disclosed herein, circuits which perform similar functions may be substituted herein, further, the invention may be used in combination with other types of data entry systems.

While the present invention has been particularly described and shown with reference to the preferred embodiment, it will be understood by those skilled in the art that the foregoing and other changes in form, dimension and detail may be made herein without departing from the spirit and scope of the invention.

Having described the invention, what is claimed as new and novel and for which it is desired to secure Letters Patent is:

1. A strobe generator for generating an output strobe signal in response to an input strobe signal, said output strobe signal indicating to a utilization device when valid keyboard generated information may be sampled, said strobe generator comprising:
   (a) a retriggerable circuit means having a fourth data input for receiving a filtered input strobe signal derived from said input strobe signal, said retriggerable circuit means for producing a clocking signal at a third data out of said retriggerable circuit means a predetermined period of time after any noise transition in said input strobe signal subsides; and
   (b) a JK flip-flop having a first data input, a second data input, a clock input, a first data output and a reset input, said first data input coupled to receive said filtered input strobe signal, said clock input coupled to said third data output of said retriggerable circuit means to receive said clocking signal, said second data input coupled to said first data output, said JK flip-flop for producing an output strobe signal at said first data output wherein said output strobe signal is in a second state when said JK flip-flop is in a first state and in a first state when said JK flip-flop is in a second state and wherein said JK flip-flop transitions from said second state to said first state to indicate that said keyboard generated information may be sampled, said reset input for receiving a reset signal for resetting said JK flip-flop to said second state after said utilization device has sampled said keyboard generated information.

2. The strobe generator of claim 1 further comprising a threshold switching means having a third data input and a second data output, said third data input for receiving said input strobe signal, said second data output coupled to said fourth data input of said retriggerable circuit means and said first data input of said JK flip-flop, said threshold switching means being switched in response to said input strobe signal going to an active state to produce a filtered input strobe signal used by said retriggerable circuit means and said JK flip-flop in place of said input strobe signal.

3. The strobe generator of claim 2 wherein said said threshold switching means is a Schmitt circuit.

4. A strobe generator for generating an output strobe signal in response to an input strobe signal, said output strobe signal indicating to a utilization device when valid keyboard generated information may be sampled, said strobe generator comprising:
   (a) a retriggerable circuit means having a fourth data input for receiving a filtered input strobe signal derived from said input strobe signal, said retriggerable circuit means for producing a clocking signal at a third data out of said retriggerable circuit means a predetermined period of time after any noise transition in said input strobe signal subsides;
   (b) a JK flip-flop having a first data input, a second data input, a clock input, a first data output and a reset input, said first data input coupled to receive said filtered input strobe signal, said clock input coupled to said third data output of said retriggerable circuit means to receive said clocking signal, said second data input coupled to said first data output, said JK flip-flop for producing an output strobe signal at said first data output wherein said output strobe signal is in a second state when said JK flip-flop is in a first state and in a first state when said JK flip-flop is in a second state and wherein said JK flip-flop transitions from said second state to said first state to indicate that said keyboard generated information may be sampled, said reset input for receiving a reset signal for resetting said JK flip-flop to said second state after said utilization device has sampled said keyboard generated information; and
   (c) a Schmitt circuit threshold switching means having a third data input and a second data output, said third data input for receiving said input strobe signal, said second data output coupled to said fourth data input of said retriggerable circuit means and said first data input of said JK flip-flop, said Schmitt circuit threshold switching means being switched in response to said input strobe signal going to an active state to produce a filtered input strobe signal used by said retriggerable circuit means and said JK flip-flop in place of said input strobe signal.

5. The strobe generator of claim 4 wherein said retriggerable circuit means is adapted to respond to each transition of said filtered input strobe signal from a third state to a fourth state by switching to said first state and thereafter automatically switching to said second state after a predetermined time period from being switched to said first state by a last of said transitions.

6. The strobe generator of claim 5 wherein said retriggerable circuit has a time constant corresponding to said predetermined time period which is selected to be less than the minimum time period during which said input strobe signal is in said active state when valid keyboard data initially becomes available and said time period is selected to be greater than the period of time between transitions in said input strobe signal due to electrostatically or electromechanically induced noise signals.

* * * * *